(12) United States Patent
Panis

(10) Patent No.: US 11,056,892 B2
(45) Date of Patent: Jul. 6, 2021

(54) BATTERY MONITORING

(71) Applicant: NXP USA, INC., Austin, TX (US)

(72) Inventor: Guerric Panis, Durenque (FR)

(73) Assignee: NXP USA, Inc., Austin, TX (US)

( * ) Notice: Subject to any disclaimer, the term of this patent is extended or adjusted under 35 U.S.C. 154(b) by 271 days.

(21) Appl. No.: 16/285,697

(22) Filed: Feb. 26, 2019

(65) Prior Publication Data
US 2020/0235589 A1 Jul. 23, 2020

(30) Foreign Application Priority Data

Jan. 21, 2019 (EP) ..................................... 19305072

(51) Int. Cl.
H02J 7/00 (2006.01)
(52) U.S. Cl.
CPC .......... H02J 7/0021 (2013.01); H02J 7/0014 (2013.01); H02J 7/0077 (2013.01)
(58) Field of Classification Search
USPC ................................................. 320/160–165
See application file for complete search history.

(56) References Cited

U.S. PATENT DOCUMENTS

| 5,914,606 A | 6/1999 | Becker-Irvin |
| 6,104,164 A | 8/2000 | Iino et al. |
| 7,696,725 B2 | 4/2010 | Liu et al. |
| 9,793,724 B2 | 10/2017 | Firehammer et al. |
| 2010/0045299 A1 | 2/2010 | Heeringa et al. |
| 2014/0312828 A1* | 10/2014 | Vo .......................... H02J 7/0016 320/103 |
| 2015/0333543 A1* | 11/2015 | Hempel .................. H02J 7/007 320/129 |
| 2018/0364310 A1* | 12/2018 | Taya ....................... H01F 38/14 |

FOREIGN PATENT DOCUMENTS

JP 2000195566 7/2000

OTHER PUBLICATIONS

MC33771 datasheet (2018).
LTC6813 datasheet (2018).
BQ76PL536A datasheet (2016).
MC33771 and MC33664 Battery Cell Controller and Transformer Physical Layer datasheet (2018).
Atmel ATA6870 datasheet (2012).

* cited by examiner

Primary Examiner — Binh C Tat

(57) ABSTRACT

Aspects of the present disclosure are directed to a method and/or apparatus for use with battery cells having an actual voltage-sourcing level that is at or above a specified battery-output level. Switch circuitry is selectively activated for passing current, and a monitoring circuit is responsive to activation of the switching circuitry by distributing energy corresponding to an actual voltage-sourcing level of a particular one of the battery cells to a voltage node. A voltage-measurement circuit provides an indication of the actual voltage-sourcing level across the particular battery cell by ascertaining voltage differentials between the voltage node and respective voltage nodes of the battery cell, the ascertained voltage differentials being less than the specified battery-output level.

20 Claims, 4 Drawing Sheets

BATTERY MONITORING

OVERVIEW

Aspects of various embodiments are directed to assessing and/or controlling aspects of stored energy resources. Such aspects may be applicable in the context of automotive battery management systems.

Battery management systems can be implemented in a variety of applications, such to monitor and control battery cells for a variety of applications. Control functions, battery health, and battery temperature may be monitored and used for managing individual batteries and battery packs. For instance, battery cells may be monitored for voltage and other performance, and managed accordingly (e.g., such as by balancing charge across multiple batteries that provide a combined source of stored energy).

Battery management systems often use an integrated circuit (IC) controller to measure and balance cell voltages. For instance, several cells may be monitored in serial, and in accordance with battery cell voltage ranges. However, such monitoring and balancing can be difficult to implement for various types of batteries. As new and different technologies evolve, battery management systems may not be capable of carrying out such functions.

SUMMARY

Various example embodiments are directed to issues such as those addressed above and/or others which may become apparent from the following disclosure concerning battery monitoring and/or balancing.

In certain example embodiments, aspects of the present disclosure involve monitoring battery voltage levels that may be greater than a specified voltage measuring range. Such approaches may involve, for example, utilizing switching circuitry to monitor different components of a battery output level and combining the measurements to provide an indication of overall battery level. Such approaches may further involve utilizing switching circuitry that may also be used for balancing the level of various battery cells within an apparatus, and/or using such switching circuitry to mitigate leakage when measurements are not being taken. These and other aspects may involve monitoring and/or balancing of automotive type battery packs, or other types of battery packs used in industrial, home and other settings.

As may be implemented in accordance with one or more embodiments, an apparatus is operable for use with a plurality of battery cells having an actual voltage-sourcing level that is at or above a specified battery-level. The apparatus includes switch circuitry configured to be selectively activated for passing current, a monitoring circuit and a voltage-measurement circuit. The monitoring circuit is configured to, in response to activation of the switching circuitry, distribute energy corresponding to an actual voltage-sourcing level of a particular one of the plurality of battery cells to a voltage node. The voltage-measurement circuit is configured to provide an indication of the actual voltage-sourcing level across the particular battery cell by ascertaining voltage differentials between the voltage node and respective voltage nodes of the particular battery cell, where the ascertained voltage differentials being less than the specified battery-output level.

In accordance with another embodiment, a method for operating a plurality of battery cells having an actual voltage-sourcing level that is at or above a specified battery-output level is carried out as follows. Switch circuitry is selectively activated for passing current, and in response to activation of the switching circuitry, energy is distributed to a voltage node with a monitoring circuit. The distributed energy corresponds to an actual voltage-sourcing level of a particular one of the plurality of battery cells. A voltage-measurement circuit is used for providing an indication of the actual voltage-sourcing level across the particular battery cell, by ascertaining voltage differentials between the voltage node and respective voltage nodes of the particular battery cell, with the ascertained voltage differentials being less than the specified battery-output level.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
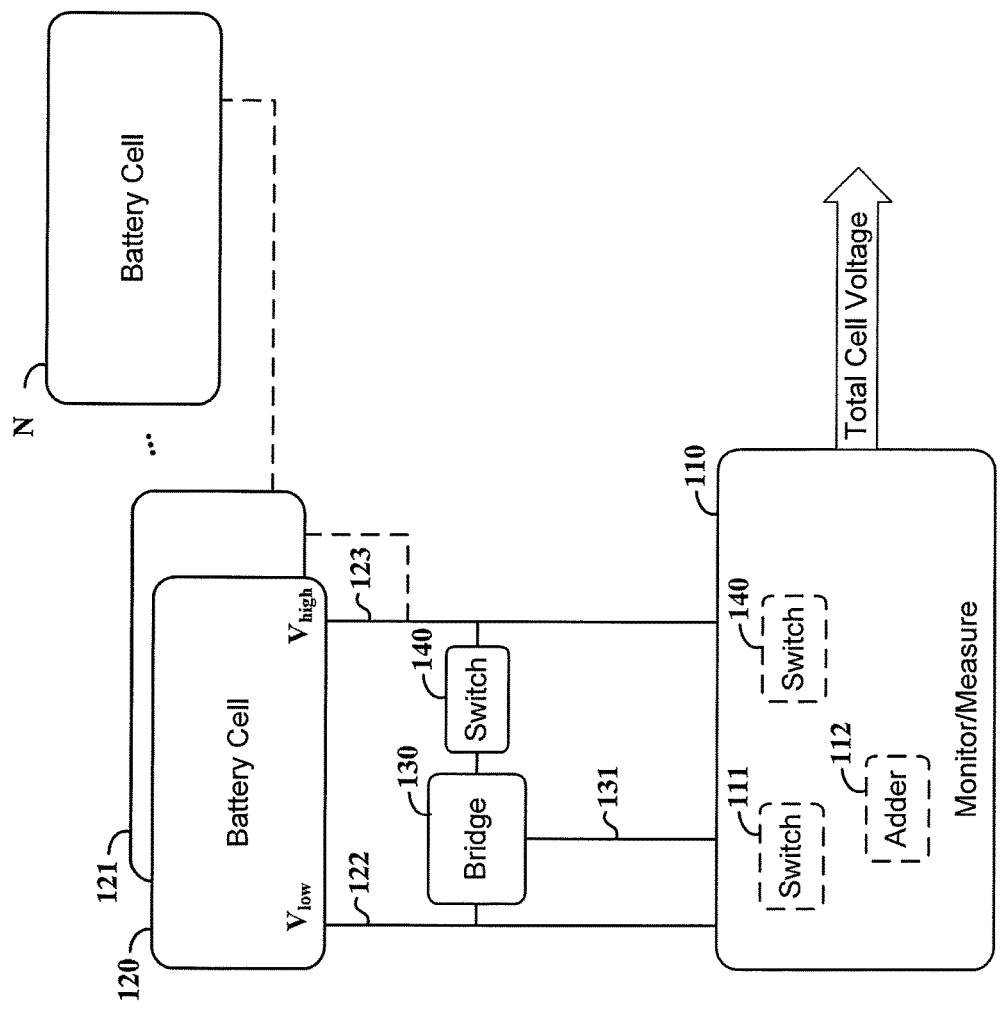
FIG. 1 illustrates an apparatus for ascertaining battery level, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving batteries and monitoring thereof, such as may be applicable to electric vehicles, hybrid electric vehicles, uninterruptible power supply (UPS) systems, premises-based energy storage systems (e.g., homes, businesses), large-scale energy storage systems for community and/or manufacturing use, in so-called green energy systems such as solar, wind and wave systems, tools, appliances, and in various industrial applications. Various aspects of the present disclosure are directed to using a battery controller circuit to monitor cell voltages that are higher than a specified voltage range otherwise directly measurable by the controller. Two (or more) measurements, such as may be provided by differential channels, are used to monitor a battery cell voltage higher than the specified channel voltage range. The respective measurements collectively provide a value corresponding to an actual voltage of the battery cell. This can be achieved with limited leakage.

In certain implementations, aspects of the present disclosure have been shown to be beneficial when used in the context of monitoring battery voltage levels in battery packs, and balancing the voltage in those packs. Such implementations may be useful for automotive applications in which the battery voltage range exceeds a nominal voltage range otherwise operable for such monitoring and balancing. In some embodiments, this involves providing partial battery voltage levels at one or more nodes that, when added, provide an indication of an actual voltage level of the battery. While not necessarily so limited, various aspects may be appreciated through the following discussion of non-limiting examples which use exemplary contexts.

In the following description, various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same or similar reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Embodiments as characterized herein may be implemented in accordance with a variety of different types of batteries and battery systems. For instance, one or more aspects of the disclosure may be implemented with battery cell controllers MC33771 and MC33772 (NXP Semiconductors, Eindhoven, The Netherlands); LTC6801-LTC6804, LTC6811, and LTC6813 (Linear Technology, Milpitas, Calif.); BQ76PL536, BQ76PL455, and EMB1432Q (Texas Instruments, Dallas, Tex.); MAX17830 and MAX17843 (Maxim, San Jose, Calif.); ISL9208, ISL78600, and ISL94212 (Intersil, Milpitas, Calif.); and ATA6870 (Atmel, San Jose, Calif./Microchip Technology of Chandler, Ariz.). One or more such battery management systems (BMS) may use an integrated circuit (IC) controller to measure the cells voltages, which may also be balanced. In various applications, such ICs monitor several cells in serial (e.g., 6 and 14), with a maximum cell voltage per channel specified. Total cell voltage for cells exceeding a specified battery level (e.g., two or more times such a level) are measured by measuring and combining portions of the total battery level. For instance, an IC battery controller can use two channels to measure respective portions of a higher cell voltage. The two channel measurements can be added digitally to retrieve the cell voltage. This architecture can be used several times on a battery pack monitoring interface, to effectively upgrade an "N" cell battery controller with a "U" Volts/cells maximum measurement into an N/2 cells battery controller with 2×U Volts/cells maximum. Some margin may be added on expected range due to IC clamp diode leakage when cell voltage is close to maximum ratings. This upgrade may be useful for new battery technologies such as solid-state (e.g., to measure 8V voltages with circuitry otherwise limited to 5V measurements).

Respective battery cell measurements may be obtained in a variety of manners. In some embodiments, an intermediate cell terminal is polarized in a manner that facilitates measurement of a partial voltage range of a cell while mitigating additional leakage in the circuit. This is done by using a resistor bridge turned ON for measurement and otherwise OFF, using a cell balancing (CB) switch system. Hence, additional leakage is added only during cell measurement, during which the leakage may be generally negligible in front of IC consumption during measurements, and removed by turning the CB switch OFF for sleep mode. Where one cell balancing switch circuit/system is used per measurement channel, the switch for one of the channels can be used to turn the polarization of the intermediate cell terminal ON and OFF, and the switch for the other of the channels can be used (in conjunction with the first switch) for cell balancing purposes. The resistor bridge can be sized to have an equivalent filtering and a good start-up time at the intermediate cell terminal, and also an acceptable leakage across the cell.

As may be implemented in accordance with one or more embodiments, an apparatus includes switch circuitry configured to be selectively activated for passing current, a monitoring circuit, and a voltage-measurement circuit, each of which are operable with a plurality of battery cells (e.g., a battery pack or assembly) having an actual voltage-sourcing level that is at or above a specified battery-level. The monitoring circuit is responsive to activation of the switching circuitry to distribute energy corresponding to an actual voltage-sourcing level of a particular one of the plurality of battery cells to a voltage node. Activation in this regard may, for example, involve coupling the monitoring circuit to one or both terminals of the particular battery cell. The voltage-measurement circuit then provides an indication of the actual voltage-sourcing level across the particular battery cell by ascertaining voltage differentials between the voltage node and respective voltage nodes/terminals of the particular battery cell. The ascertained voltage differentials are each less than the actual voltage-sourcing level, yet when combined provide an indication of the entire voltage-sourcing level.

Such an approach may, for example, be useful in ascertaining the actual voltage-sourcing level of a battery using two or more measurements obtained via the voltage-measurement circuit, which otherwise is incapable of directly measuring the entire voltage-sourcing level. This may be useful to permit utilization of components in high voltage applications involving voltages larger than the components are designed for. For instance, certain analog-to-digital converters (ADCs) operate with a maximum voltage range for use in battery applications involving a relatively low (e.g., 5V) voltage-sourcing level. In battery packs having relatively high voltage battery cells (e.g., 7V, 8V or higher), this approach can facilitate measurement of a total voltage of the battery cells. Further, this can be done in battery packs using the same switching circuitry for cell balancing and while limiting current leakage. Various such aspects are discussed further below.

The monitoring circuit may distribute the energy in a variety of manners. In some embodiments, bridging circuitry is used to provide a voltage level at the voltage node that is a fraction of the voltage level provided by the particular battery cell. The switch circuitry operates with the bridging circuitry by, in response to being activated, connecting a high voltage node of the particular battery cell to the bridging circuitry, therein providing the voltage at the voltage node. When the switching circuitry is de-activated, current leakage is mitigates by effectively disconnecting the bridging circuitry from the particular battery cell.

Bridging circuitry as noted above may utilize resistor circuitry that, when coupled to one or both terminals of a particular battery cell, provides an intermediate voltage level on an intermediate terminal. In a particular embodiment, the bridging circuitry includes a first resistor connected in a circuit path extending from the switch circuitry to the voltage node, and a second resistor in series with the first resistor and connected in a circuit path extending between the voltage node and a reference or ground node.

The monitoring circuitry may be implemented in a variety of manners, to suit particular embodiments. In some embodiments, the monitoring circuit distributes the energy corresponding to the actual voltage-sourcing level of one of the plurality of battery cells to the voltage node by providing a voltage level that is between a high voltage level and a low voltage level of the particular battery cell. To facilitate this approach, the monitoring circuit may utilize resistors to provide the voltage level that is between the high voltage level and the low voltage level of the particular battery cell. In certain embodiments, the monitoring circuit includes resistors configured to provide a filtering constant at the voltage node that matches filtering at the respective voltage nodes of the particular battery cell.

For multiple cell monitoring, the switch circuitry and monitoring circuit may be couple to each of the plurality of battery cells for determining a voltage differential across each cell. In some embodiments, additional ones of the switch circuitry and the monitoring circuit are utilized for other ones of the plurality of battery cells, in which the monitoring circuits are connected to one another to balance voltage levels between the respective battery cells. In such applications, the voltage-measurement circuit may utilize ascertained voltage differentials for all cells. In certain balancing embodiments, the switch circuitry balances voltage differentials across respective ones of the battery cells by connecting the particular battery cell to another one of the plurality of battery cells.

The voltage-measurement circuit may be implemented in a variety of manners. In some embodiments, the voltage-measurement circuit combines the ascertained voltage differentials to provide an actual voltage differential across the battery cell that exceeds a maximum voltage differential measurable by the voltage-measurement circuit. For certain applications, the voltage-measurement circuit may ascertain voltage differentials sequentially, and thereafter add the ascertained voltage differentials to provide an actual voltage differential across the particular battery cell. This approach may be further carried out with multiple battery cells. Further, the voltage-measurement circuit can be operated by power provided at or below a maximum operating-voltage level that is less than the actual voltage-sourcing level. In such applications, the monitoring circuit may operate at the actual voltage-sourcing level (e.g., while the voltage-measurement circuit operates at a lower voltage level), and provide the voltage differentials to the voltage-measurement circuit at or below the maximum operating-voltage level.

In accordance with another embodiment, a plurality of battery cells having an actual voltage-sourcing level that is at or above a specified battery-output level are operated as follows. Switch circuitry is selectively activated for passing current, and in response to activation of the switching circuitry, a monitoring circuit distributes energy to a voltage node, in which the distributed energy corresponds to an actual voltage-sourcing level of a particular one of the plurality of battery cells. A voltage-measurement circuit provides an indication of the actual voltage-sourcing level across the particular battery cell by ascertaining voltage differentials between the voltage node and respective voltage nodes of the particular battery cell. The ascertained voltage differentials are less than the specified battery-output level, facilitating measurement of a lower voltage. Further, the ascertained voltage differentials may be combined to provide an actual voltage differential across the battery cell that exceeds a maximum voltage differential measurable by the voltage-measurement circuit. Further, the switch circuitry may be used to balance voltage differentials across respective ones of the battery cells by connecting the particular battery cell to another one of the plurality of battery cells.

Distributing the energy in this regard may involve providing a voltage level that is between a high voltage level and a low voltage level of the particular battery cell. In certain embodiments, bridging circuitry is used to provide a voltage level at the voltage node that is a fraction of a voltage level provided by the particular battery cell. The switches are selectively activated to connect a high voltage node of the particular battery cell to the bridging circuitry, therein providing the voltage at the voltage node, and for mitigating current leakage by disconnecting the bridging circuitry from the particular battery cell. Distributing energy in this regard may involve using resistors to provide a filtering constant at the voltage node that matches filtering at the respective voltage nodes of the particular battery cell.

Turning now to the figures, FIG. 1 illustrates an apparatus 100 for ascertaining battery level, in accordance with the present disclosure. The apparatus 100 includes a monitoring/measuring circuit 110 for monitoring one or more battery cells, with battery cells 120 and 121-N shown by way of example. A bridge circuit 130 and switch circuit 140 operate to, when the switch circuit is active for coupling the bridge circuit between low and high voltage terminals 122 and 123 of battery 120, provide an intermediate voltage level at intermediate cell terminal 131. The switch circuit 140 may, for example, be integrated within the monitoring/measuring circuit 110 as shown in dashed lines. The monitoring/measuring circuit 110 then uses this intermediate voltage level for ascertaining respective partial voltage differentials between the battery's low (122) terminal and the intermediate cell terminal 131, and between the intermediate cell terminal 131 and the battery's high voltage terminal 123.

In some instances, the monitoring/measuring circuit 110 includes an adder circuit 112 that adds the partial voltage differentials to provide a total voltage differential across the low and high voltage terminals 122 and 123. This may be carried out using, for example, circuitry operable over a limited voltage range that is less than the total voltage differential.

The monitoring/measuring circuit 110 may be implemented in a variety of manners. In some instances, the monitoring/measuring circuit 110 includes a further switch 111, which operates with switch 140 for balancing between respective battery cells. For instance, where similar bridge/switch circuitry is implemented with battery cell 121 (coupled via dashed line as shown), the respective cell voltages can be balanced accordingly.

Figure 2:
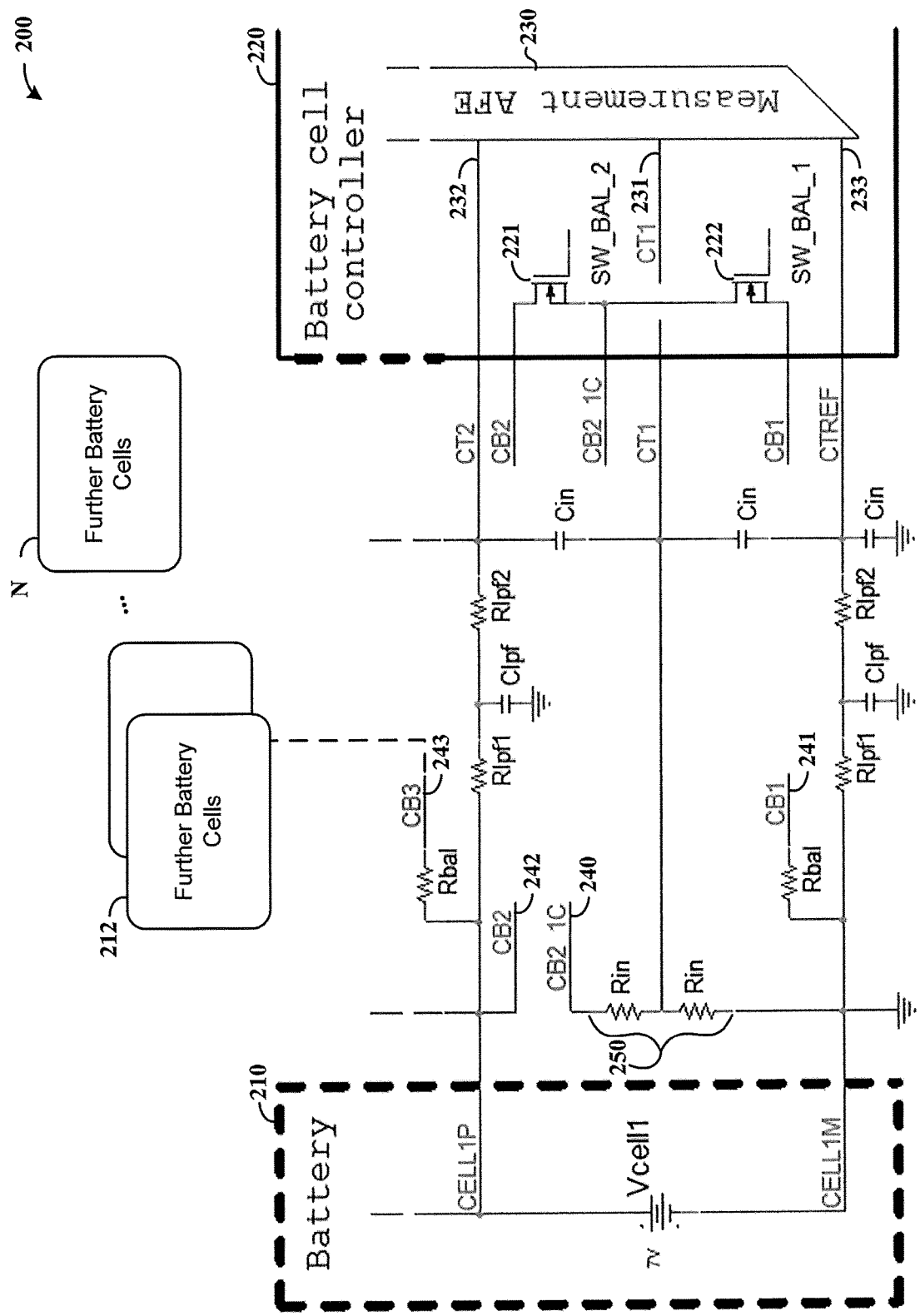
FIG. 2 illustrates another apparatus for ascertaining battery level, in accordance with the present disclosure.

FIG. 2 illustrates another apparatus 200 for ascertaining battery level, in accordance with the present disclosure. The apparatus 200 includes a battery cell controller (circuitry) 220 and various connecting circuits for ascertaining the level of battery cell 210 and further operable with one or more additional battery cells 212-N for cell balancing. The battery cell controller includes switch 221 coupled to nodes CB2 (242) and CB2_1C (240), and switch 222 coupled to nodes CB1 (241) and 240 as well. A resistor bridge 250 is coupled between node 240 and a reference/ground node, and when coupled to node 242 via switch 221 or to node 241 via switch 222, provides an intermediate cell voltage CT1 (231). A measurement circuit 230 (e.g., including an analog-to-digital converter (ADC)) ascertains voltage differentials between node 231 and 232, and between node 231 and 233. These differentials can then be added to ascertain the total battery voltage level of cell 210, or other ones of cells 212-N when connected similarly. For instance, where the measurement circuit 230 is configured to measure a maximum voltage differential of 5V and the battery cell 210 operates at 7V, providing the intermediate node 231 facilitates measuring partial voltages of the total battery cell voltage, which can be added and used accordingly. Further, both switches 221 and 222 may be utilized concurrently to provide a measurement of the respective voltage differentials.

Switches 221 and 222 may also be used to facilitate cell balancing when activated. Specifically, with switches 221 and 222 closed, a current path is provided from the high voltage node CELL1P of the battery 210 to node 242, through switch 221 and switch 222, and to node 241 and the low voltage node CELL1M of the battery. A balancing resistor Rbal may further be used at node 241 in this regard to facilitate balancing. A further balancing resistor Rbal may be used at node 243 (CB3) when additional battery cells are coupled as shown.

The circuitry shown and/or various additional circuitry can be configured and utilized to facilitate measurement and control, to suit particular applications. For example, the Rin resistors used in the bridge circuit 250 can be sized to have an equivalent impedance at the input of the measurement circuitry 230. Filtering circuitry may also be utilized, such as resistors Rlpf1 and Rlpf2 with a node therebetween coupled to reference/ground via capacitor Clpf, an sized accordingly. For instance, if Rlpf1 is 3 kOhm and Rlpf2 is 2 kOhm, Rin can be sized at twice the combined amount at 10 kOhm (2×(2 k+3 k)), to provide a similar bandwidth and a similar filter output impedance. Mirrored capacitors Cin can also be coupled as shown to nodes 231, 232 and 233, and to further battery cells if applicable.

Accordingly, two channels may be used to measure a single battery cell 210, utilizing an intermediate cell terminal CT1 relative to a high voltage terminal (CT2) and reference voltage (CTREF). The intermediate cell terminal CT1 is polarized at the middle cell voltage with a resistor bridge made by Rin resistors. Further, the bridge leakage on the battery cell 210 can be removed when measurement of the cell is not needed, by turning the switch 221 (and/or 222) OFF. When the measurement is OFF, the circuit leakage is generally negligible and depends on the switches and cell terminal channel leakages. Further, this configuration can be utilized on respective channels of a plurality of battery cells in a pack, for instance resulting in transformation of a 14 cell battery controller with a 5V/cell voltage range capability into a 7 channel battery controller with 10V/cell voltage range capability. Some margin may be added on the range (e.g., because of clamp diodes, additional leakage may be added from 8 to 10V).

Figure 3:
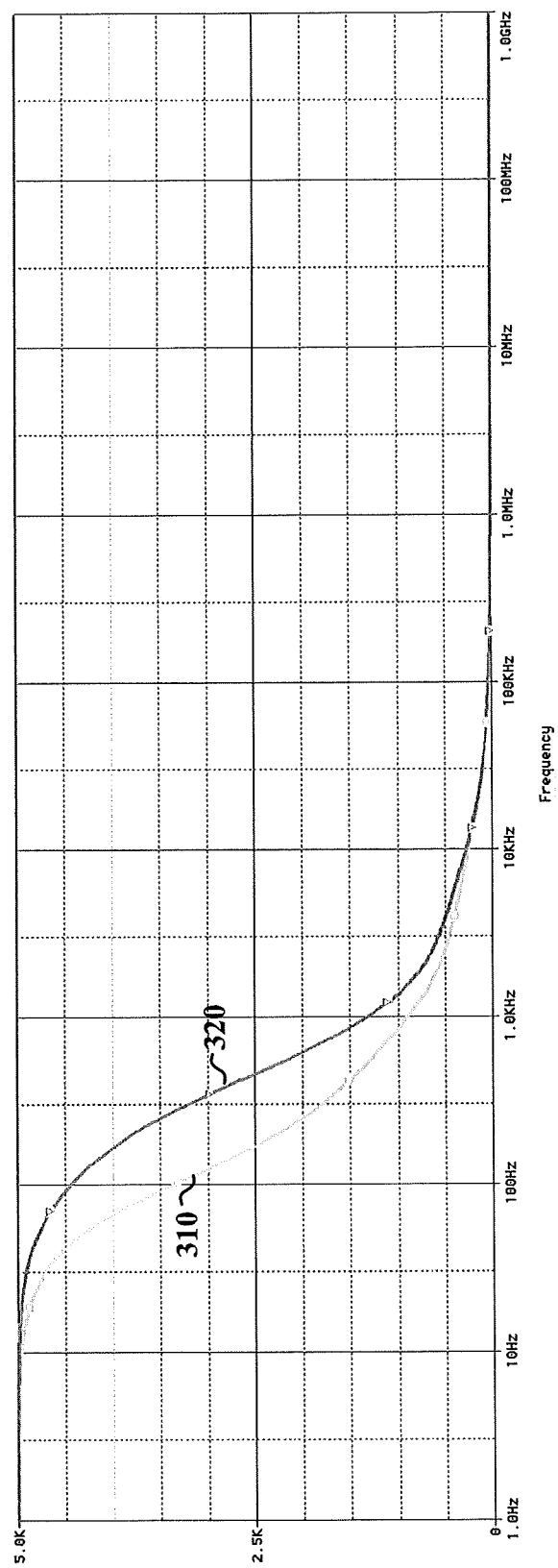
FIG. 3 illustrates plots of filtering with a bridge, as may be implemented in accordance with the present disclosure.

FIG. 3 illustrates a plot of filtering with and without a bridge, as may be implemented in accordance with the present disclosure. The vertical axis shows resistance (kOhms) and the horizontal axis shows frequency. Plot 310 shows an example filtering output without a bridge, and plot 320 shows performance with a bridge (e.g., 250 of FIG. 2).

Figure 4:
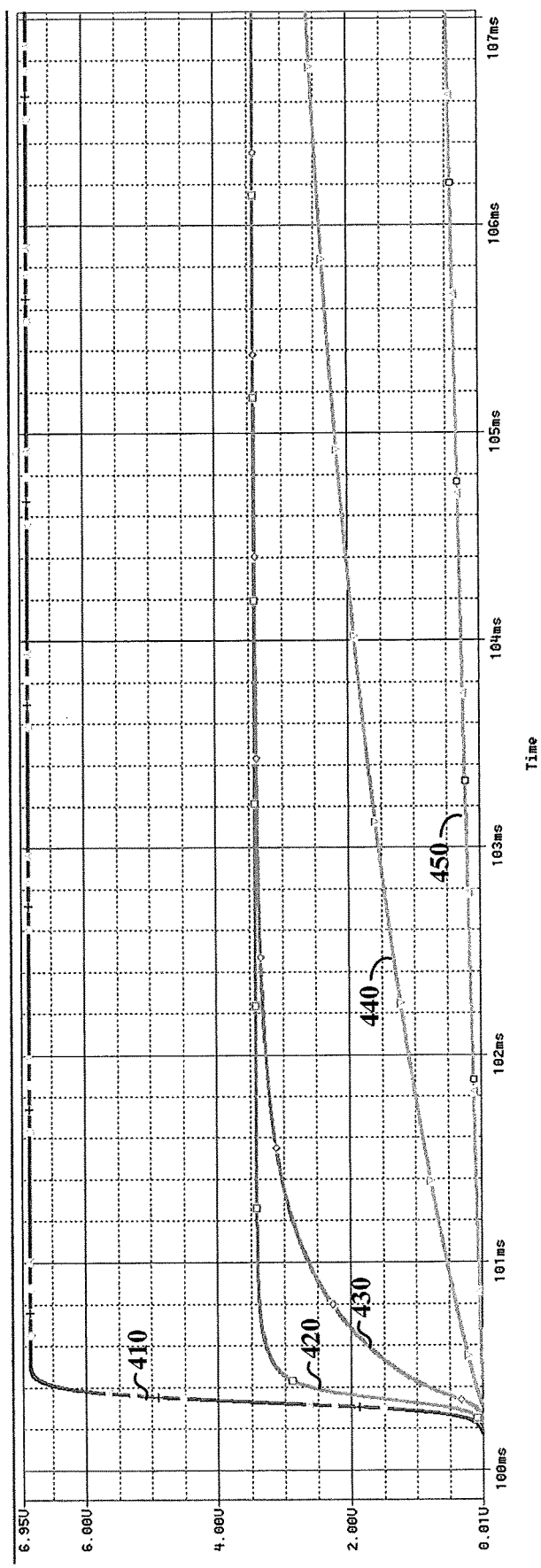
FIG. 4 illustrates plots of terminal rise time for different types of filters, as may be implemented in accordance with the present disclosure.

FIG. 4 illustrates plots of terminal rise time for different types of filters, as may be implemented in accordance with the present disclosure. Referring to FIG. 2 by way of example, sizing of the resistors Rin in the bridge 250 may provide a trade-off between measurement turn ON time and cell leakage during measurement. The plots in FIG. 4 represent 7V battery cell measurements. Plot 410 depicts voltage at a high voltage cell node, and plots 420-450 depict rise time of a corresponding intermediate cell terminal using bridge resistors (Rin) of 1 kOhm, 10 kOhm, 100 kOhm and 1 MOhm, respectively (e.g., implemented with the circuit shown in FIG. 2, with Cin=47 nF).

As discussed herein, leakage from a bridge can be mitigated by turning the bridge off when not being used for measuring. The following chart depicts exemplary leakage at various battery cell levels with respective bridge resistor sizes, as may be utilized with FIG. 2.

| | Bridge leakage (uA) | | | |
|---|---|---|---|---|
| | Rin (kOhm) | | | |
| Vcell (V) | 1 | 10 | 100 | 1000 |
| 5 | 2500 | 250 | 25 | 2.5 |
| 6 | 3000 | 300 | 30 | 3 |
| 7 | 3500 | 350 | 35 | 3.5 |
| 8 | 4000 | 400 | 40 | 4 |
| 9 | 4500 | 450 | 45 | 4.5 |
| 10 | 5000 | 500 | 50 | 5 |

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the specification describes and/or illustrates aspects useful for implementing the claimed disclosure by way of various circuits or circuitry which may be illustrated as or using terms such as blocks, modules, device, system, unit, controller, bridge, switch and/or other circuit-type depictions (e.g., reference numerals 110, 111, 112, 130 and 140 of FIG. 1 and battery cell controller 220 of FIG. 2 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1 and 2 (e.g., for controlling various switching circuits for coupling the bridge 250 and/or for cell balancing). In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described in connection with the operation of switches 221 and 222 above used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, additional channels may be created to measure even higher voltage levels. Further, the same circuitry may be utilized for selective coupling to multiple battery cells. Such modifications do not depart from the true spirit and scope of various aspects of the disclosure, including aspects set forth in the claims.

What is claimed is:

1. An apparatus for use with a plurality of battery cells each having an actual voltage-sourcing level that is at or above a specified battery output-level, the apparatus comprising:
   an intermediate cell terminal operational as a voltage node;
   switching circuitry configured and arranged to be selectively activated for passing current;
   a bridging circuit configured and arranged to, in response to activation of the switching circuitry, pass current to distribute energy from a particular one of the plurality of battery cells to the voltage node, such that the voltage node is intermediate the voltage-sourcing level of the particular battery cell; and
   a voltage-measurement circuit configured and arranged to provide an indication of the actual voltage-sourcing level across the particular battery cell by ascertaining, in respective first and second channels of the multichannel battery controller, voltage differentials between the voltage node and respective voltage nodes of the particular battery cell, the ascertained voltage differentials being less than the specified battery output-level, and to combine the ascertained voltage differentials to provide an indication of the actual voltage-sourcing level of the particular battery cell.

2. The apparatus of claim 1, wherein the actual voltage differential exceeds a maximum voltage differential measurable by the voltage-measurement circuit.

3. The apparatus of claim 1, wherein the bridging circuit is configured and arranged to distribute the energy corresponding to the actual voltage-sourcing level of one of the plurality of battery cells to the voltage node by providing a voltage level that is between a high voltage level and a low voltage level of the particular battery cell.

4. The apparatus of claim 3, wherein the bridging circuit includes resistors configured and arranged to provide the voltage level that is between the high voltage level and the low voltage level of the particular battery cell.

5. The apparatus of claim 1,
   wherein the bridging circuitry is configured and arranged to provide a voltage level at the voltage node that is a fraction of a voltage level provided to the bridging circuitry by the particular battery cell; and
   the switch circuitry is configured and arranged to
      in response to being activated, connect a high voltage node of the particular battery cell to the bridging circuitry, therein providing the voltage at the voltage node, and
      in response to being de-activated, mitigate current leakage by disconnecting the bridging circuitry from the particular battery cell.

6. The apparatus of claim 5, wherein the bridging circuitry includes a first resistor connected in a circuit path extending from the switch circuitry to the voltage node, and a second resistor in series with the first resistor and connected in a circuit path extending between the voltage node and a reference or ground node.

7. The apparatus of claim 1, wherein the switch circuitry and the bridging circuit are configured and arranged to couple to each of the plurality of battery cells for determining a voltage differential across each cell.

8. The apparatus of claim 1, further including additional ones of the switch circuitry and the bridging circuit for other ones of the plurality of battery cells, wherein the monitoring circuits are connected to one another to balance voltage levels between the respective battery cells.

9. The apparatus of claim 1, wherein the switch circuitry is configured and arranged to balance voltage differentials across respective ones of the battery cells by connecting the particular battery cell to another one of the plurality of battery cells.

10. The apparatus of claim 1, wherein the voltage-measurement circuit is configured and arranged to ascertain the voltage differentials sequentially, and thereafter, add the ascertained voltage differentials to provide an actual voltage differential across the particular battery cell.

11. The apparatus of claim 1, wherein the voltage-measurement circuit is configured and arranged to be operated by power provided at or below a maximum operating-voltage level that is less than the actual voltage-sourcing level.

12. The apparatus of claim 11, wherein the bridging circuit is configured and arranged to operate at the actual voltage-sourcing level and to provide the voltage differentials to the voltage-measurement circuit at or below the maximum operating-voltage level.

13. The apparatus of claim 1, wherein the plurality of battery cells are arranged as a pack or assembly.

14. The apparatus of claim 1, wherein the bridging circuit includes resistors configured and arranged to provide a filtering constant at the voltage node that matches filtering at the respective voltage nodes of the particular battery cell.

15. A method for operating a plurality of battery cells having an actual voltage-sourcing level that is at or above a specified battery-output level, the method comprising:
   selectively activating switch circuitry for passing current;
   in response to activation of the switching circuitry, passing current to distribute energy to a voltage node with a monitoring circuit, the energy corresponding to an actual voltage-sourcing level of a particular one of the plurality of battery cells, the voltage node being at an intermediate battery cell terminal, such that the voltage node is intermediate the voltage-sourcing level of the particular battery cell; and
   using a voltage-measurement circuit, providing an indication of the actual voltage-sourcing level across the particular battery cell by ascertaining, in respective first and second channels of the multichannel battery controller, voltage differentials between the voltage node and respective voltage nodes of the particular battery cell, the ascertained voltage differentials being less than the specified battery-output level, and to combine the ascertained voltage differentials to provide an indication of the actual voltage-sourcing level of the particular battery cell.

16. The method of claim 15, further including the actual voltage differential exceeding a maximum voltage differential measurable by the voltage-measurement circuit.

17. The method of claim 15, wherein distributing the energy corresponding to the actual voltage-sourcing level of one of the plurality of battery cells includes providing a voltage level that is between a high voltage level and a low voltage level of the particular battery cell.

18. The method of claim 15, wherein
  distributing the energy includes utilizing bridging circuitry to provide a voltage level at the voltage node that is a fraction of a voltage level provided to the bridging circuitry by the particular battery cell; and
  wherein selectively activating the switch circuitry includes:
   for activation of monitoring the particular battery cell, connecting a high voltage node of the particular battery cell to the bridging circuitry, therein providing the voltage at the voltage node, and
   for de-activation of monitoring the particular battery cell, mitigating current leakage by disconnecting the bridging circuitry from the particular battery cell.

19. The method of claim 15, further including utilizing the switch circuitry to balance voltage differentials across respective ones of the battery cells by connecting the particular battery cell to another one of the plurality of battery cells.

20. The method of claim 15, wherein distributing the energy to the voltage node includes using resistors to provide a filtering constant at the voltage node that matches filtering at the respective voltage nodes of the particular battery cell.

* * * * *